United States Patent
Kaji et al.

(10) Patent No.: US 9,153,703 B2
(45) Date of Patent: Oct. 6, 2015

(54) THIN-FILM TRANSISTOR AND METHOD OF MANUFACTURING SAME

(75) Inventors: Nobuyuki Kaji, Kawasaki (JP); Ryo Hayashi, Yokohama (JP); Hisato Yabuta, Machida (JP); Katsumi Abe, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 288 days.

(21) Appl. No.: 12/527,622

(22) PCT Filed: Feb. 8, 2008

(86) PCT No.: PCT/JP2008/052597
§ 371 (c)(1),
(2), (4) Date: Aug. 18, 2009

(87) PCT Pub. No.: WO2008/105250
PCT Pub. Date: Sep. 4, 2008

(65) Prior Publication Data
US 2010/0051937 A1 Mar. 4, 2010

(30) Foreign Application Priority Data
Feb. 28, 2007 (JP) .................................. 2007-050004

(51) Int. Cl.
*H01L 21/336* (2006.01)
*H01L 29/786* (2006.01)
*H01L 29/10* (2006.01)

(52) U.S. Cl.
CPC ........ *H01L 29/78696* (2013.01); *H01L 29/105* (2013.01); *H01L 29/7869* (2013.01)

(58) Field of Classification Search
USPC ........................ 257/72, 59, E29.295; 438/795
See application file for complete search history.

(56) References Cited

U.S. PATENT DOCUMENTS

| 7,189,992 B2 | 3/2007 | Wager, III et al. | 257/43 |
| 7,205,640 B2 | 4/2007 | Yoshioka et al. | 257/646 |
| 7,262,463 B2 | 8/2007 | Hoffman | |
| 7,339,187 B2 | 3/2008 | Wager, III et al. | 257/43 |
| 7,564,055 B2 | 7/2009 | Hoffman | |
| 7,645,478 B2 | 1/2010 | Thelss et al. | |

(Continued)

FOREIGN PATENT DOCUMENTS

| EP | 1 737 044 A1 | 12/2006 |
| JP | 2002-076356 | 3/2002 |

(Continued)

OTHER PUBLICATIONS

Choi et al., "Conduction mechanisms and interface property of silicon oxide films sputtered under different oxygen concentrations", Journal of Applied Physics 83, 4810 (1998).*

(Continued)

*Primary Examiner* — Thomas L Dickey
(74) *Attorney, Agent, or Firm* — Fitzpatrick, Cella, Harper & Scinto (57) ABSTRACT

There is provided a thin-film transistor including at least a substrate, a gate electrode, a gate insulating layer, an oxide semiconductor layer, a source electrode, a drain electrode and a protective layer, wherein the oxide semiconductor layer is an amorphous oxide containing at least one of the elements In, Ga and Zn, the gate electrode-side carrier density of the oxide semiconductor layer is higher than the protective layer-side carrier density thereof, and the film thickness of the oxide semiconductor layer is 30 nm±15 nm.

2 Claims, 8 Drawing Sheets

(56) References Cited

U.S. PATENT DOCUMENTS

| | | |
|---|---|---|
| 8,143,678 B2 | 3/2012 | Kim et al. |
| 2005/0017302 A1 | 1/2005 | Hoffman |
| 2006/0108636 A1* | 5/2006 | Sano et al. .................. 257/347 |
| 2006/0113539 A1* | 6/2006 | Sano et al. .................... 257/59 |
| 2006/0163674 A1 | 7/2006 | Cho ............................ 257/404 |
| 2006/0220023 A1* | 10/2006 | Hoffman et al. ............... 257/72 |
| 2006/0228974 A1 | 10/2006 | Thelss et al. |
| 2007/0054507 A1* | 3/2007 | Kaji et al. ..................... 438/795 |
| 2007/0072439 A1* | 3/2007 | Akimoto et al. ............. 438/795 |
| 2007/0090365 A1* | 4/2007 | Hayashi et al. ................ 257/72 |
| 2007/0187760 A1* | 8/2007 | Furuta et al. ................. 257/347 |
| 2007/0194379 A1 | 8/2007 | Hosono et al. ............... 257/347 |
| 2007/0267699 A1 | 11/2007 | Hoffman |
| 2007/0272922 A1* | 11/2007 | Kim et al. ...................... 257/43 |
| 2008/0182358 A1* | 7/2008 | Cowdery-Corvan et al. . 438/104 |
| 2008/0191204 A1 | 8/2008 | Kim et al. |
| 2009/0072232 A1* | 3/2009 | Hayashi et al. ................ 257/43 |
| 2009/0072233 A1 | 3/2009 | Hayashi et al. ................ 257/43 |
| 2011/0042669 A1 | 2/2011 | Kim et al. |

FOREIGN PATENT DOCUMENTS

| | | |
|---|---|---|
| JP | 2005-268724 A | 9/2005 |
| JP | 2006-100810 A | 4/2006 |
| JP | 2006-165529 A | 6/2006 |
| JP | 2007-042690 A | 2/2007 |
| JP | 2008-199005 A | 8/2008 |
| WO | 2005/074038 A1 | 8/2005 |
| WO | WO 2005/093846 A1 | 10/2005 |
| WO | WO 2005/093847 A1 | 10/2005 |
| WO | WO 2005/093848 A1 | 10/2005 |
| WO | WO 2005/093849 A1 | 10/2005 |
| WO | WO 2005/093850 A1 | 10/2005 |
| WO | WO 2005/093851 A1 | 10/2005 |
| WO | WO 2005/093852 A1 | 10/2005 |
| WO | 2006/105028 A1 | 10/2006 |

OTHER PUBLICATIONS

K. Nomura et al., "Room temperature fabrication of transparent flexible thin-film transistors using amorphous oxide semiconductors," Letters to Nature, vol. 432, Nov. 25, 2004, pp. 488-492.

P. Barquinha et al., "Influence of the semiconductor thickness on the electrical properties of transparent TFTs based on Indium zinc oxide," Journal of Non-Crystalline Solids, 2006, pp. 1749-1752.

Nikkei Microdevices, Feb. 2006, pp. 73-75 (Partial English-Language Translation).

Japanese Office Action issued in the counterpart application No. 2007-050004 dated Jul. 4, 2012, along with its English-language translation—5 pages.

Taiwanese Office Action issued in corresponding application No. 097105911 dated Aug. 29, 2011—13 pages including the English translation.

Japanese Office Action issued in counterpart application No. 2012-187567 dated Feb. 25, 2014, along with its English-language translation—7 pages.

English-language translated excerpt of JP 2005-268724—4 pages, JP-2005-268724 published Sep. 29, 2005.

\* cited by examiner

THIN-FILM TRANSISTOR AND METHOD OF MANUFACTURING SAME

TECHNICAL FIELD

The present invention relates to a thin-film transistor using an oxide semiconductor, a method of manufacturing the thin-film transistor, and a display unit using the thin-film transistor. More particularly, the present invention relates to a thin-film transistor using an oxide semiconductor and capable of being used as the switching device of a display unit, such as an LCD and an organic EL display, a method of manufacturing the thin-film transistor, and a display unit using the thin-film transistor.

BACKGROUND ART

In recent years, there has been actively developed a thin-film transistor (TFT) which uses a transparent polycrystalline oxide thin film formed using ZnO as a primary constituent for the channel layer of the TFT (refer to Japanese Patent Application Laid-Open No. 2002-076356). Since the thin film can be formed at low temperatures and is transparent to visible light, it is considered possible to form flexible transparent TFTs on a substrate, such as a plastic plate or film.

Nature, 488, 432, (2004) discloses a technique to use a transparent amorphous oxide semiconductor layer (a-IGZO) made of indium, gallium, zinc and oxygen for the channel layer of a TFT. The literature shows that flexible, transparent TFTs exhibiting an excellent electric field-effect mobility of 6 to 9 $cm^2V^{-1}s^{-1}$ can be formed at a room temperature on a substrate, such as a polyethylene terephthalate (PET) film.

J. Non-Crystalline Solid, 352 (2006), 1749-1752 shows that in a TFT using an oxide semiconductor layer made of indium, zinc and oxygen, it is possible to control the electric field-effect mobility μ, the on/off ratio, and the S value of the TFT by controlling the thickness of the oxide semiconductor layer.

In addition, Nikkei Microdevices, February, 2006, p. 74, Table 2, describes that the operation of flexible electronic paper has been verified using a TFT that uses an a-IGZO.

DISCLOSURE OF THE INVENTION

Figure 1:
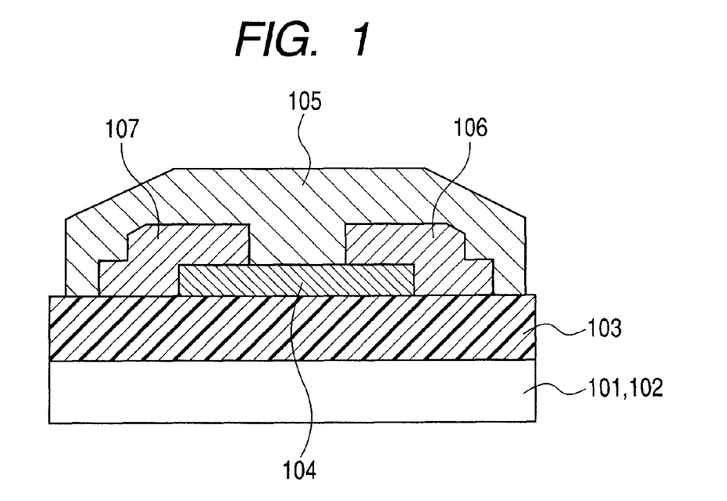
FIG. 1 is a schematic view illustrating a bottom-gate TFT with a protective layer using a thermally-oxidized film as a gate insulating layer.

The present inventors have conducted energetic research and development on a bottom-gate TFT with a protective layer using such an oxide semiconductor as shown in FIG. 1. As a result, the inventors have found that the carrier density of an oxide semiconductor interface changes depending on a film-forming (which is also referred to as a deposition) atmosphere when forming the protective layer. The bottom-gate TFT uses a substrate 101 made of low-resistance n-type crystalline silicon as a gate electrode 102. The bottom-gate TFT is comprised of a gate insulating film 103, which is made of a thermal silicon oxide and formed on the substrate 101 also serving the gate electrode 102, an oxide semiconductor 104, a protective layer 105, a source electrode 106, and a drain electrode 107. According to the knowledge of the present inventors, a threshold voltage Vth and Von (Von is a voltage applied to the gate when a drain current (Id) rises in the Vg-Id characteristic of the TFT) change (also referred to as "shift") in the Vg-Id characteristic, depending on formation conditions. For example, an off-state current becomes significantly large when the protective layer is formed in an Ar atmosphere, thereby making no favorable TFT characteristics unavailable. This is considered due to an increase in the amount of carriers in the oxide semiconductor interface. The amount of carriers in the oxide semiconductor interface decreases if the amount of oxygen contained in a film-forming gas is increased.

Figure 2:
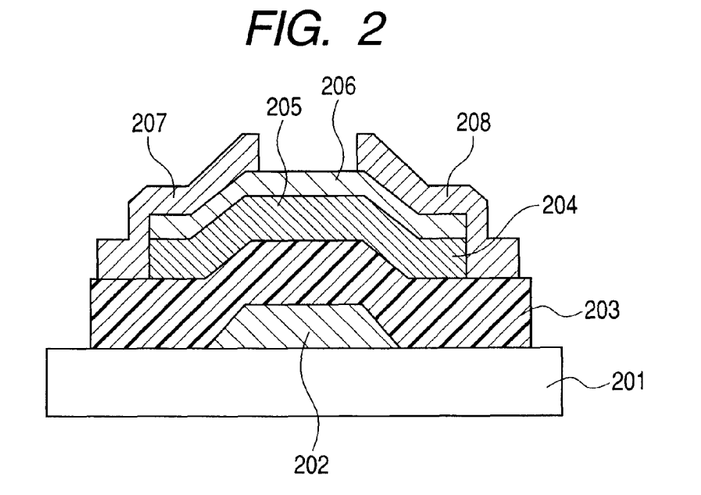
FIG. 2 is a schematic view illustrating a bottom-gate TFT model, the active layer of which is formed of two layers having different carrier densities.
Figure 3A:
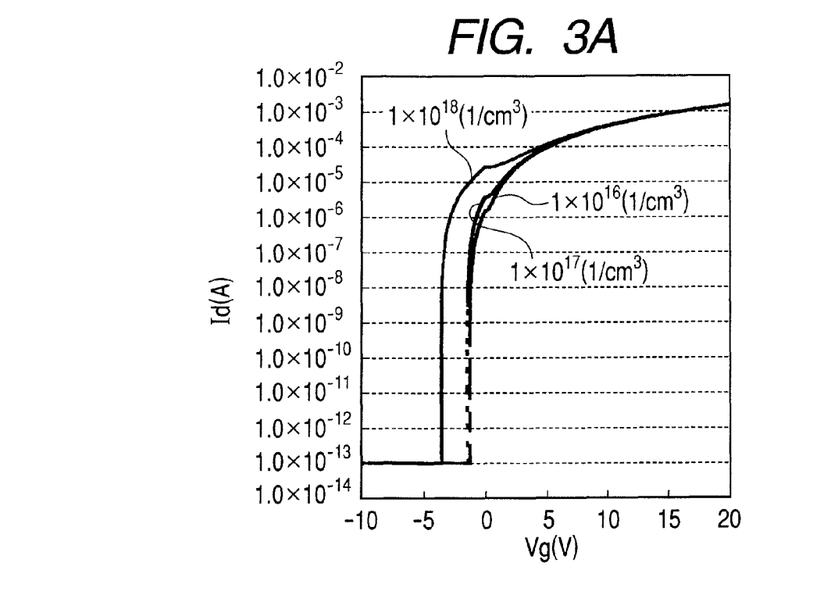
FIGS. 3A and 3B are graphical views illustrating the results of simulating the bottom-gate TFT model, the active layer of which is formed of two layers having different carrier densities.
Figure 3B:
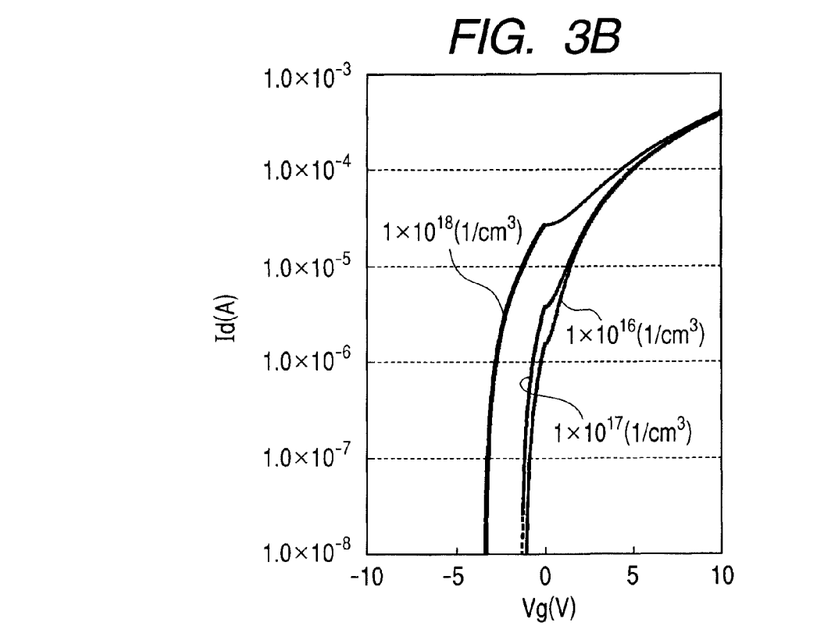

Hence, the following simulation was carried out, in order to examine how Von was affected in a case where a carrier density distribution was present in the oxide semiconductor layer. That is, a simulation was performed on a Vg-Id characteristic in such a bottom-gate (inversely staggered) TFT model, the oxide semiconductor layer of which was formed of two layers having different carrier densities, as shown in FIG. 2. The TFT is comprised of a substrate 201, a gate electrode 202, a gate insulating film 203, an oxide semiconductor A 204, an oxide semiconductor B 205, a protective layer 206, a source electrode 207, and a drain electrode 208. The result of this simulation is illustrated in FIG. 3, where the oxide semiconductor layer was set to a thickness of 30 nm, 25 nm of which was a gate insulating layer-side thickness, and Vth was set to 0 V. In addition, calculations were made by fixing the gate insulating layer-side carrier density of the oxide semiconductor layer to $1\times10^{17}$ ($1/cm^3$) and setting the protective layer-side carrier density thereof to $1\times10^{16}$ ($1/cm^3$), $1\times10^{17}$ ($1/cm^3$) and $1\times10^{13}$ ($1/cm^3$). FIG. 3B is a partially enlarged view of FIG. 3A. From this result, it is understood that if the protective layer-side carrier density is made higher than the gate insulating layer-side carrier density, Von shifts toward a more negative side than when the carrier densities are the same. Conversely, it is understood that if the protective layer side-carrier density is made lower than the gate insulating layer-side carrier density, Von shifts toward a more positive side, though slightly, than when the carrier densities are the same.

In a luminescent display unit, a thin-film transistor (TFT) is frequently used as a switching device for controlling luminescence. The power consumption P of the switching device when the TFT is used as the switching device of a luminescent display unit can be represented as p∝C·ΔV·f/2. Here, C denotes the capacitance of mostly wirings, ΔV denotes an AC voltage amplitude (Vth−Von)+margin, and f denotes an AC frequency. This relational expression shows that the power consumption P increases as the ΔV becomes larger. Considering environmental load, it is desirable that the power consumption be low. As is understood from the simulation result described earlier, Von shifts toward a negative side if the carrier density of the protective layer-side interface of the oxide semiconductor is higher than the carrier density of the gate insulating layer-side interface thereof. Consequently, Vth−Von becomes larger and the power consumption increases.

The present invention has been accomplished in view of the above-described problem. It is therefore an object of the present invention to provide a thin-film transistor and a method of manufacturing the thin-film transistor wherein the carrier density of the protective layer-side interface of an oxide semiconductor layer is lower than the gate insulating layer-side carrier density thereof.

In addition, as is disclosed in J. Non-Crystalline Solid, 352, (2006), 1749-1752, it is known that the electron field-effect mobility μ, the on/off ratio, and the S value vary depending on the film thickness of the oxide semiconductor layer. Hence, it is another object of the present invention to optimize the film thickness of an amorphous oxide semiconductor layer that includes at least one of the elements In, Ga and Zn.

The present invention is directed to a thin-film transistor comprising at least a substrate, a gate electrode, a gate insulating layer, an oxide semiconductor layer, a source electrode, a drain electrode and a protective layer, wherein the oxide semiconductor layer is an amorphous oxide containing at least one of the elements In, Ga and Zn, the gate electrode-side carrier density of the oxide semiconductor layer is higher than the protective layer-side carrier density thereof, and the film thickness of the oxide semiconductor layer is 30 nm±15 nm. In addition, the thin-film transistor is a bottom-gate transistor.

The present invention is also directed to a method of manufacturing a thin-film transistor, comprising at least forming a gate electrode on a substrate, forming a gate insulating layer, forming an oxide semiconductor layer, forming a source electrode and a drain electrode, and forming a protective layer, wherein the forming of the protective layer is performed by a sputtering method in an oxygen-containing atmosphere. In addition, the oxygen-containing atmosphere is a mixed gas of $O_2$ and Ar. Furthermore, the $O_2$/Ar mixing ratio of the mixed gas of $O_2$ and Ar is 20% or more and 50% or less.

The present invention is also directed to a display unit comprising at least a thin-film transistor and a display device connected to the thin-film transistor through an electrode, wherein the above-described thin-film transistor is used as the thin-film transistor.

According to the present invention, it is possible to reduce power consumption in a display unit which uses a bottom-gate thin-film transistor with a protective layer using an oxide semiconductor.

BEST MODES FOR CARRYING OUT THE INVENTION

Best mode of the present invention will be described in detail hereinafter with reference to the accompanying drawings.

First, the structure and the manufacturing method of a TFT according to the present invention will be described.

Figure 4:
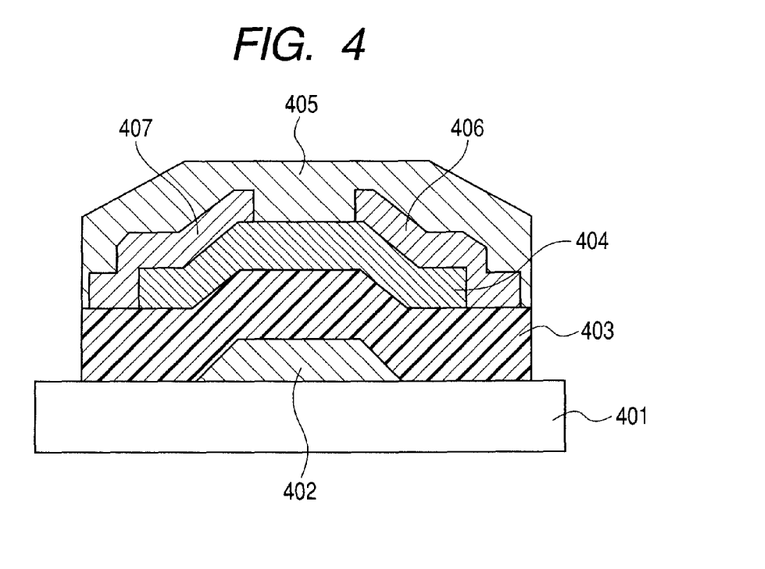
FIG. 4 is a schematic view illustrating a bottom-gate TFT with a protective layer according to the present invention.

FIG. 4 illustrates a cross section of a bottom-gate (inversely staggered) TFT of the present invention. The bottom-gate TFT is formed of a substrate 401, a gate electrode 402, a gate insulating layer 403, a channel layer 404, a protective layer 405, a source electrode 406, and a drain electrode 407.

As the substrate 401, a glass substrate is used. In the present invention, a 1737 glass substrate made by Corning is used as the glass substrate.

As the gate electrode 402, the source electrode 406 and the drain electrode 407, films of metal, such as Au, Pt, Al, Ni or Ti, or oxides, such as ITO or $RuO_2$, are used. For the gate insulating layer 403, $SiO_2$ is desirably used. Alternatively, a material containing at least one of $SiO_2$, $Y_2O_3$, $Al_2O_3$, $HfO_2$ and $TiO_2$ can be used as the gate insulating layer.

As a method of film-forming the gate insulating layer 403, a vapor deposition method, such as a sputtering method, a pulse laser vapor deposition method, or an electron beam vapor deposition method can be suitably used. However, the film-forming method is not limited to these methods.

The channel layer 404 is an oxide semiconductor layer and, more specifically, an amorphous oxide containing at least one of In, Ga and Zn. Alternatively, the channel layer 404 may be an amorphous oxide further containing at least one of Al, Fe, Sn, Mg, Ca, Si and Ge, in addition to In, Ga or Zn, and having a conductivity of $10^{-7}$ S/cm or more and $10^{-3}$ S/cm or less.

Figure 5:
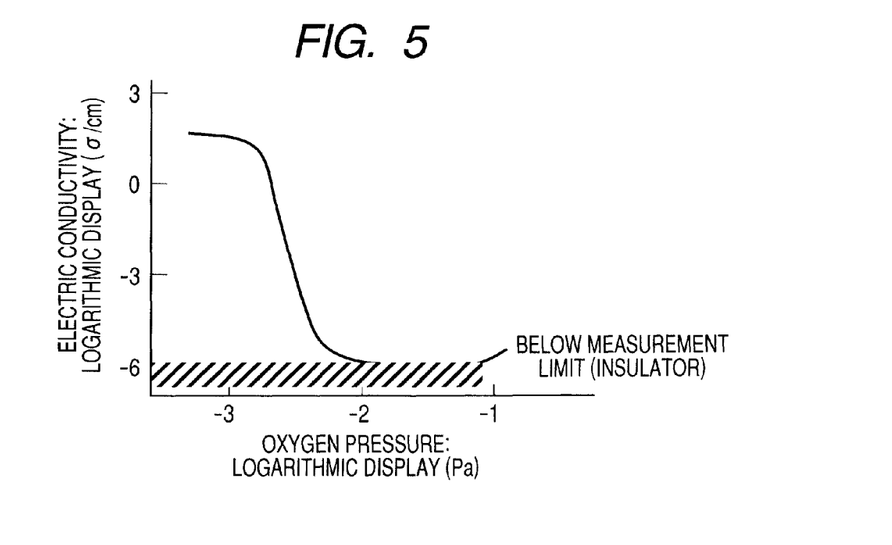
FIG. 5 is a graphical view illustrating the dependence of carrier concentration upon an oxygen partial pressure.

Under normal conditions, an oxygen partial pressure is controlled at the time of film-forming, in order to control the electric conductivity and the electron carrier concentration of an oxide. That is, mainly the amount of oxygen deficiency in thin films is controlled by controlling the oxygen partial pressure, thereby controlling the electron carrier concentration. FIG. 5 is a graphical view illustrating one example of the dependence of a carrier concentration on an oxygen partial pressure when an In—Ga—Zn—O-based oxide film is formed by a sputtering method. By highly controlling the oxygen partial pressure, it is possible to obtain a semi-insulating film which is a semi-insulating amorphous oxide film having an electron carrier concentration of $10^{14}$ to $10^{18}$/cm³. Thus, an excellent TFT can be fabricated by applying this thin film to a channel layer.

As a method of film-forming the channel layer 404, it is desirable to use a vapor deposition method, such as a sputtering method, a pulse laser vapor deposition method, or an electron beam vapor deposition method. However, the film-forming method is not limited to these methods.

In addition, from the relationship among the electron field-effect mobility $\mu$, the on/off ratio, the threshold voltage Vth and the S value, the film thickness of the oxide semiconductor is desirably 30 nm±15 nm including a margin. The reason for this will be described in detail in the later-described exemplary embodiments.

For the protective layer 405, a metal oxide film containing at least one metal element is used. Among metal oxides, one containing at least one of the oxides listed below is more desirably used as the protective layer:

$SiO_2$, $Al_2O_3$, $Ga_2O_3$, $In_2O_3$, MgO, CaO, SrO, BaO, ZnO, $Nb_2O_5$, $Ta_2O_5$, $TiO_2$, $ZrO_2$, $HfO_2$, $CeO_2$, $Li_2O$, $Na_2O$, $K_2O$, $Rb_2O$, $Sc_2O_3$, $Y_2O_3$, $La_2O_3$, $Nd_2O_3$, $Sm_2O_3$, $Gd_2O_3$, $Dy_2O_3$, $Er_2O_3$, and $Yb_2O_3$.

Furthermore, a silicon oxynitride ($SiO_xN_y$) may be used in place of these metal oxides.

As a method of forming any of the above-described metal oxides or $SiO_xN_y$ on the TFT as a protective layer, a sputtering method is used. Film-forming is carried out in an oxygen-containing atmosphere during sputtering. In this example, a mixed gas of $O_2$ and Ar is used as the oxygen-containing atmosphere.

According to the knowledge of the present inventors, there is no upper limit for the $O_2$/Ar mixing ratio of a sputtering film-forming gas (which is also referred to as a sputtering deposition gas) under the condition of forming amorphous $SiO_x$ having an effect of suppressing such oxygen-defect production as described earlier. Thus, the suppression effect is also available in a 100% $O_2$ gas atmosphere. However, the speed of film-forming decreases as the result of the $O_2$/Ar mixing ratio being increased. From the viewpoint of productivity and cost, the $O_2$/Ar mixing ratio of the sputtering film-forming gas is optimally approximately 50% or lower. The relationship between the $O_2$/Ar mixing ratio of the sputtering film-forming gas and the film-forming speed of amorphous $SiO_x$ is also dependent on film-forming parameters, such as a film-forming gas pressure and a substrate-to-target distance. In particular, this relationship is extremely sensitive to an oxygen partial pressure. For this reason, film-forming conditions with a high oxygen partial pressure are less frequently used as a rule. Under these film-forming conditions, the film-forming speeds were 77% and 39%, respectively, for $O_2$/Ar gas mixing ratios of 10% and 50% when an $O_2$/Ar gas mixing ratio of 0% was defined as the standard (100%) of film-forming speed. Since the carrier density of the oxide semiconductor interface becomes higher for an $O_2$/Ar gas mixing ratio of 10% or lower, Vth and Von shift greatly. Accordingly, the $O_2$/Ar mixing ratio of the sputtering film-forming gas is desirably 20% or more and 50% or less.

By carrying out film-forming as described above, the gate electrode-side carrier density of the oxide semiconductor layer, which is a channel layer, becomes higher than the protective layer-side carrier density thereof. Thus, the power consumption of the thin-film transistor becomes lower.

Next, a specific configuration example of the display unit of the present invention will be described using a cross-sectional drawing of the display unit.

A display unit can be configured by connecting the electrode of a display device, such as an organic or inorganic electroluminescence (EL) device or a liquid crystal device, to the drain which is the output terminal of the above-described thin-film transistor.

Figure 6:
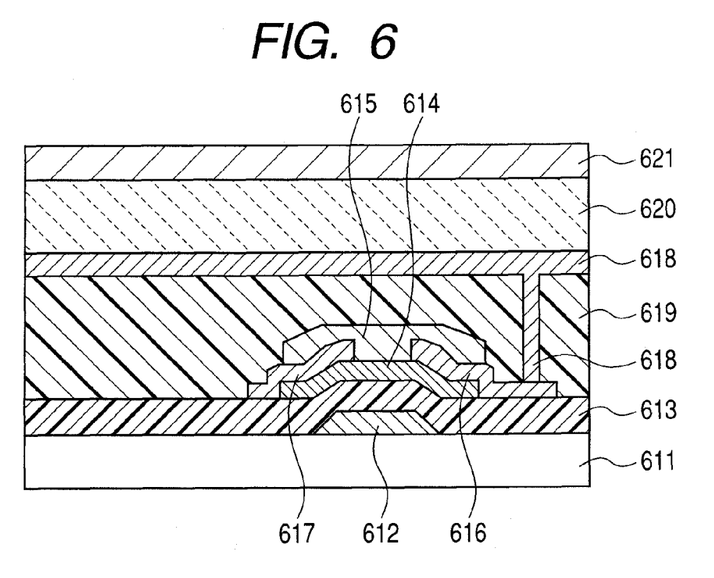
FIG. 6 is a schematic view illustrating a cross section of one example of a display unit according to the present invention.

For example, as illustrated in FIG. 6, a TFT comprised of a gate electrode 612, a gate insulating layer 613, an oxide semiconductor layer 614, a protective layer 615, a source (drain) electrode 616 and a drain (source) electrode 617 is formed on a substrate 611. An electrode 618 is connected to the drain (source) electrode 617 through an interlayer insulating layer 619. The electrode 618 is in contact with a luminescent layer 620 and the luminescent layer 620 is in contact with an electrode 621. With such a configuration as described above, it is possible to control a current injected into the luminescent layer 620 by a current flowing from the source (drain) electrode 616 to the drain (source) electrode 617 through a channel formed in the oxide semiconductor layer 614. Accordingly, the current can be controlled by the voltage of the gate 612 of the TFT. Note here that the electrode 618, the luminescent layer 620 and the electrode 621 form an organic or inorganic electro-luminescence device.

Figure 7:
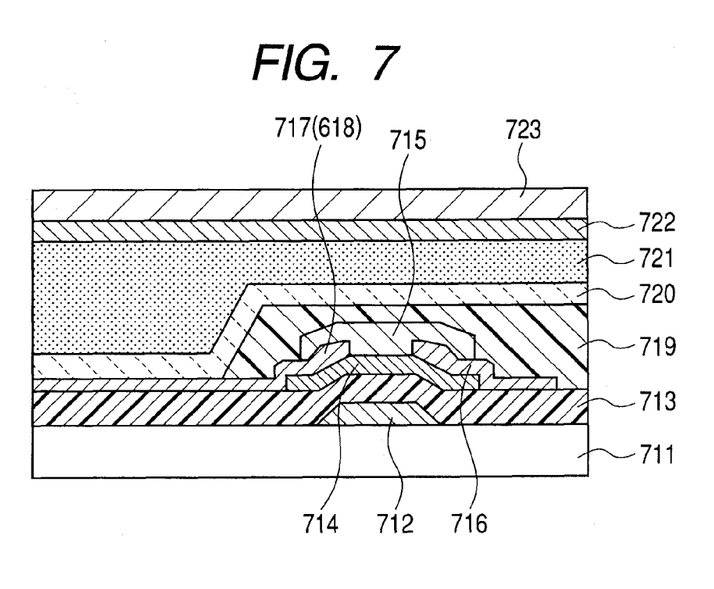
FIG. 7 is a schematic view illustrating a cross section of another example of a display unit according to the present invention.

Alternatively, a configuration can be employed in which a drain (source) electrode 717 extended so as to also serve as an electrode 718, as shown in FIG. 7, is used as an electrode 723 whereby a voltage is applied to a liquid crystal cell or an electrophoretic particle cell 721 held between high-resistance films 720 and 722. The liquid crystal cell or electrophoretic particle cell 721, the high-resistance films 720 and 722, the electrode 718, and the electrode 723 form a display device. The voltage applied to these display devices can be controlled by a current flowing from the source electrode 716 to the drain electrode 717 through a channel formed in the oxide semiconductor layer 714. Accordingly, the current can be controlled by the voltage of the gate 712 of the TFT. Note here that the high-resistance films 720 and 722 are not necessary if the display medium of the display device is a capsule wherein a fluid and particles are sealed within an insulating film.

The above-described two examples illustrate that a pair of electrodes for driving the display device are provided in parallel with the substrate. However, the present exemplary embodiment is not limited to this configuration. For example, either one or both of the electrodes may be provided vertical to the substrate as long as the connection between the drain electrode, which is the output terminal of the TFT, and the display device remains topologically the same.

The above-described two examples also illustrate that only one TFT connected to the display device is shown. However, the present invention is not limited to this configuration. For example, the TFT shown in the figure may further be connected to another TFT.

In a case where the pair of electrodes for driving the display device are provided in parallel with the substrate, either one of the electrodes is required to be transparent to an emission wavelength or the wavelength of reflecting light, if the display device is a reflective display device, such as an EL device or a reflective liquid crystal device. If the display device is a transmissive display device, such as a transmissive liquid crystal device, both electrodes are required to be transparent to transmitting light.

Furthermore, all structures can be made transparent in the TFT of the present exemplary embodiment. Hence, it is possible to form a transparent display device. Such a display device can also be provided on a less heat-resistant substrate, including a plastic substrate made of a lightweight, flexible, transparent resin.

EXEMPLARY EMBODIMENTS

Next, exemplary embodiments of the present invention will be described using the accompanying drawings. However, the present invention is not limited to the exemplary embodiments described hereinafter.

Exemplary Embodiment 1

In the present exemplary embodiment, a bottom-gate (inversely staggered) TFT illustrated in FIG. 1 was fabricated. The TFT in FIG. 1 uses low-resistance n-type crystalline silicon for a substrate 101 also serving as a gate electrode 102, and a thermal silicon oxide for a gate insulating film 103. The TFT further includes an oxide semiconductor 104, a protective layer 105, a source electrode 106 and a drain electrode 107.

First, a 20 nm thick In—Ga—Zn—O oxide semiconductor was deposited by an RF sputtering method on the low-resistance n-type crystalline silicon substrate as the oxide semiconductor layer 104, using a polycrystalline sintered object having an $InGaO_3$ (ZnO) composition as a target. In the present exemplary embodiment, the RF power applied at that time was 200 W. The atmosphere applied at the time of film-forming was at a full pressure of 0.5 Pa, and the gas flow rate ratio at that time was Ar:$O_2$=95:5. The film-forming rate was 8 nm/min. In addition, the substrate temperature was 25° C.

Photolithography and etching methods were applied to the deposited In—Ga—Zn—O oxide semiconductor to process the oxide semiconductor into an appropriate size. Next, a 5 nm thick Ti film, a 50 nm thick Au film, and another 5 nm thick Ti film were deposited in this order. Then, the source electrode 106 and the drain electrode 107 were deposited by photolithography and lift-off methods.

An $SiO_2$ film was further deposited as the protective layer 105 on top of these electrodes to a thickness of 100 nm by a sputtering method. In the present exemplary embodiment, the RF power applied at that time was 400 W. The atmosphere applied at the time of film-forming was at a full pressure of 0.1 Pa, and the gas flow rate ratio at that time was $Ar:O_2=50:50$. The film-forming rate was 2 nm/min. In addition, the substrate temperature was 25° C.

Next, the upper portions of the drain electrode 106 and the source electrode 107 were partially removed by photolithography and etching methods to form contact holes, thereby fabricating the TFT.

Figure 8:
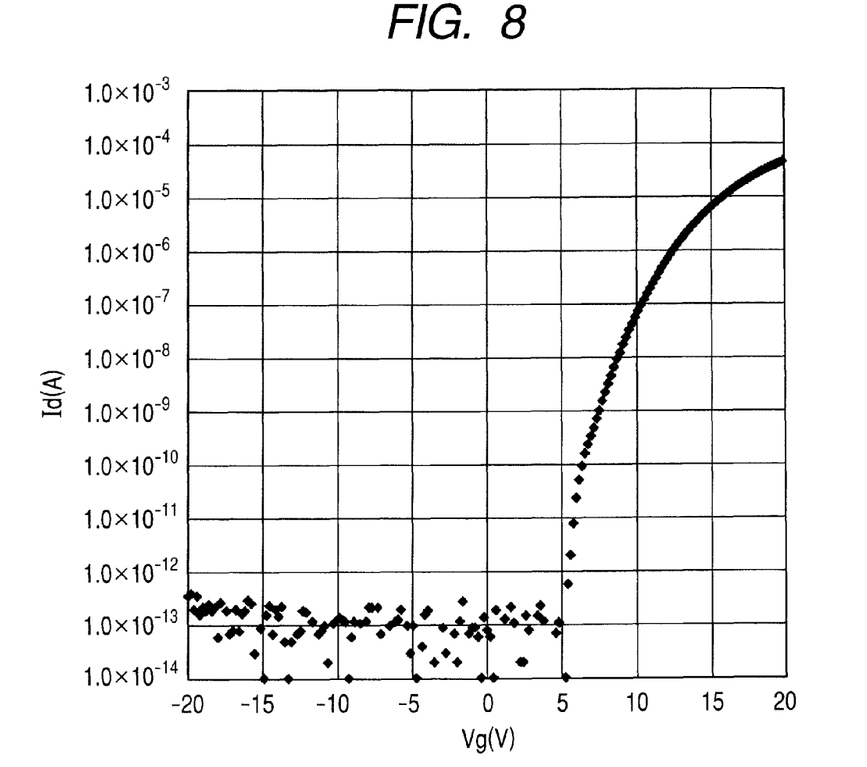
FIG. 8 is a graphical view illustrating the transfer characteristic of a TFT fabricated in Exemplary Embodiment 1.

FIG. 8 is a graphical view illustrating the transfer characteristic of the TFT fabricated in the present exemplary embodiment. The TFT characteristics evaluated from this graph were as follows: threshold voltage Vth=11.57V, Von=5.75V, mobility $\mu$=8.03 ($cm^2/V \cdot s$), S value=0.63 (V/decade), on/Off ratio=$10^{8.35}$.

Comparative Example 1

In this comparative example, TFTs were fabricated in those cases where the atmosphere was an Ar gas and where the gas flow rate ratio was $Ar:O_2=90:10$ when forming the protective layer in Exemplary Embodiment 1, to characterize the TFTs.

Figure 9:
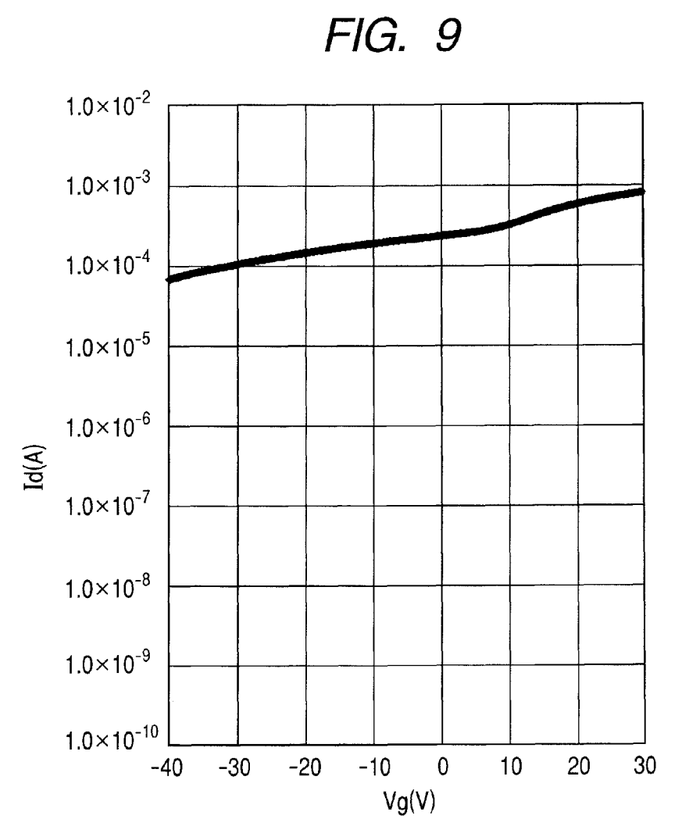
FIG. 9 is a graphical view illustrating the transfer characteristic of a TFT (protective layer-forming atmosphere: Ar gas) fabricated in Comparative Example 1.
Figure 10:
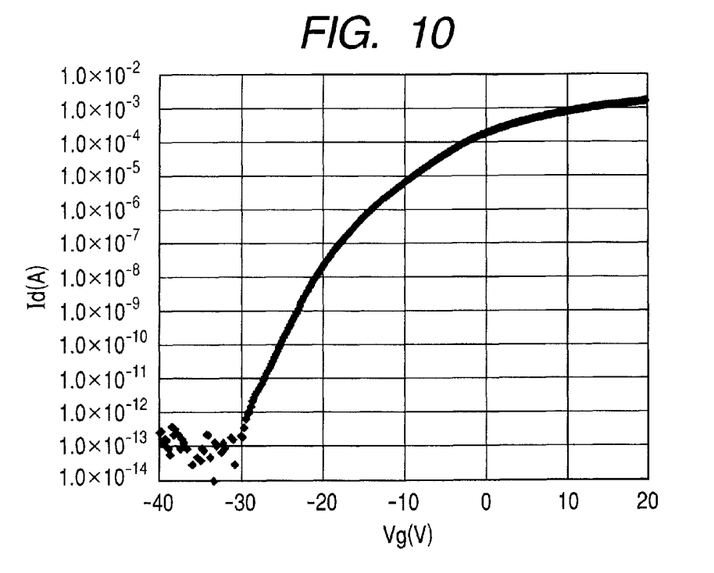
FIG. 10 is a graphical view illustrating the transfer characteristic of a TFT (protective layer-forming atmosphere: Ar:$O_2$=90:10 gas) fabricated in Comparative Example 1.

FIGS. 9 and 10 illustrate the transfer characteristics of the respective TFTs.

From FIG. 9, it is understood that the TFT, the protective layer of which was formed in an Ar gas, has a significantly large off-state current and, therefore, favorable TFT characteristics are not available. The possible reason for this is that as the result of the protective layer having been formed in an Ar gas atmosphere, the carrier density of an oxide semiconductor interface became significantly high.

According to FIG. 10, the characteristic values of the TFT, the protective layer of which was fabricated with a gas flow rate ratio of $Ar:O_2=90:10$ were as follows: threshold voltage Vth=−9.3 V, Von=−25.3 V.

From the results described above, it is understood that the value of Vth−Von has become larger than the value in Exemplary Embodiment 1. Consequently, it is understood that the amount of $O_2$ is insufficient if the $O_2$/Ar gas mixing ratio is 10%.

Comparative Example 2

In this comparative example, TFTs were fabricated by setting the film thickness of the oxide semiconductor to 10 nm, 30 nm and 50 nm in Exemplary Embodiment 1, with other conditions kept the same as in Exemplary Embodiment 1, to characterize the TFTs.

Figure 11:
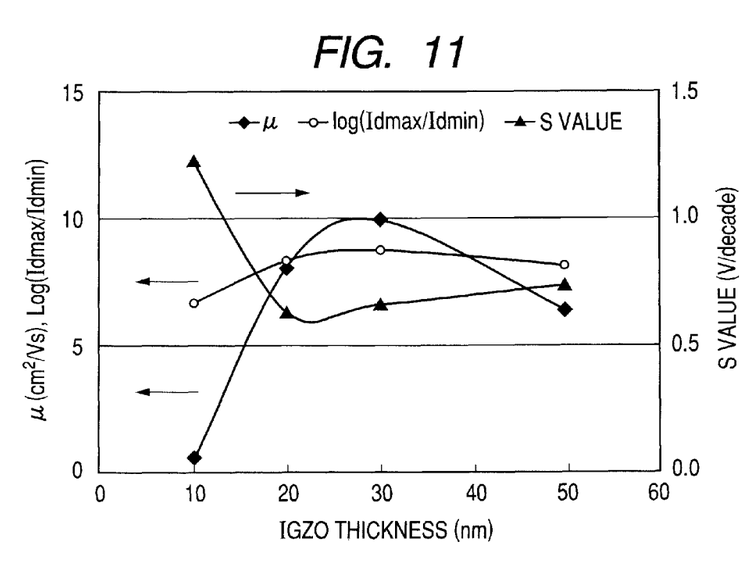
FIG. 11 is a graphical view where the axis of abscissa represents the film thickness of an oxide semiconductor and the axis of ordinate represents the mobility $\mu$, the on/off ratio (Log(Idmax/Idmin)) and the S value.

FIG. 11 shows the characteristic values (mobility $\mu$, on/off ratio (Log(Idmax/Idmin)), and S value) of the TFTs evaluated from the transfer characteristics of the TFTs fabricated with the respective film thicknesses.

In the TFT in which the film thickness of an oxide semiconductor is 10 nm, it is understood that the mobility and the on/off ratio are low and the S value is large, thus exhibiting unfavorable TFT characteristics. It is also understood that the mobility and the on/off ratio are optimum at 30 nm for a film thickness of the oxide semiconductor of 20 nm or greater, and the S value worsens as the film thickness increases.

Accordingly, a film thickness of 30 nm±15 nm including a margin is considered desirable.

Exemplary Embodiment 2

In the present exemplary embodiment, the bottom-gate TFT illustrated in FIG. 4 was fabricated.

As a substrate 401, a Corning 1737 glass substrate was used. First, a 5 nm thick Ti film, a 50 nm thick Au film, and another 5 nm thick Ti film were deposited in this order on the substrate 401 by an electron beam deposition method. The deposited films were formed into a gate electrode 402 by photolithography and lift-off methods. In addition, a 200 nm thick $SiO_2$ film was formed on top of the electrode by an RF sputtering method to form a gate insulating layer 403. Subsequently, a 20 nm thick In—Ga—Zn—O oxide semiconductor was deposited as a channel layer 404 by an RF sputtering method using a polycrystalline sintered object having an $InGaO_3$(ZnO) composition as a target.

In the present exemplary embodiment, the RF power applied was 200 W. The atmosphere applied at the time of film-forming was at a full pressure of 0.5 Pa, and the gas flow rate ratio at that time was $Ar:O_2=95:5$. The film-forming rate was 8 nm/min. In addition, the substrate temperature was 25° C.

Photolithography and etching methods were applied to the deposited In—Ga—Zn—O oxide semiconductor to process the oxide semiconductor into an appropriate size. Next, a 5 nm thick Ti film, a 50 nm thick Au film, and another 5 nm thick Ti film were deposited in this order. Then, the source electrode 406 and the drain electrode 407 were formed by photolithography and lift-off methods. In addition, an $SiO_2$ film was formed on top of the electrodes to a thickness of 100 nm by a sputtering method as a protective layer 405.

In the present exemplary embodiment, the RF power applied was 400 W. The atmosphere applied at the time of film-forming was at a full pressure of 0.1 Pa, and the gas flow rate ratio at that time was $Ar:O_2=50:50$. The film-forming rate was 2 nm/min. In addition, the substrate temperature was 25° C.

Next, the upper portions of the gate electrode 401, the drain electrode 406 and the source electrode 407 were partially removed by photolithography and etching methods to form contact holes. Finally, annealing was carried out at 200° C. to fabricate the TFT.

Figure 12:
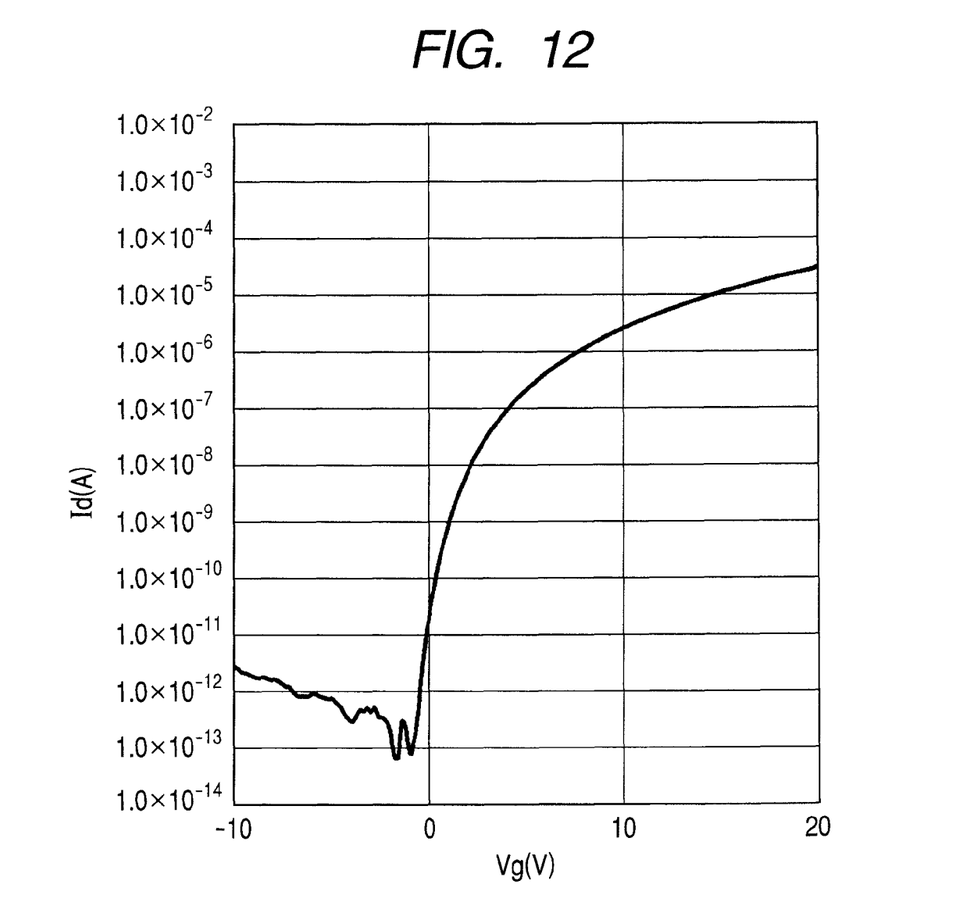
FIG. 12 is a graphical view illustrating the transfer characteristic of a TFT fabricated in Exemplary Embodiment 2.

FIG. 12 is a graphical view illustrating the transfer characteristic of the TFT fabricated in the present exemplary embodiment. The TFT characteristics evaluated from this graph were as follows: threshold voltage Vth=8.1 V, Von=0.3V, mobility=4.11 ($cm^2/V \cdot s$), S value=0.58 (V/decade), On/Off ratio=$10^{8.63}$.

Exemplary Embodiment 3

In the present exemplary embodiment, a display unit using the TFT illustrated in FIG. 4 will be described.

First, a method of manufacturing the TFT will be described using FIG. 4.

As a substrate 401, a Corning 1737 glass substrate was used. A 150 nm thick ITO film was formed on the substrate 401 by a sputtering method. Next, a gate electrode 402 was formed using photolithography and etching methods. In addition, a 200 nm thick $SiO_2$ film was formed on top of the gate electrode by an RF sputtering method, to form a gate insulating layer 403. Subsequently, a 20 nm thick In—Ga—Zn—O oxide semiconductor was deposited as a channel layer 404 by an RF sputtering method using a polycrystalline sintered object having an InGaO$_3$(ZnO) composition as a target. In the present exemplary embodiment, the RF power applied at that time was 200 W. The atmosphere applied at the time of film-forming was at a full pressure of 0.5 Pa, and the gas flow rate ratio at that time was Ar:O$_2$=95:5. The film-forming rate was 8 nm/min. In addition, the substrate temperature was 25° C.

Photolithography and etching methods were applied to the deposited In—Ga—Zn—O oxide semiconductor to process the oxide semiconductor into an appropriate size. Next, an ITO film was formed by a sputtering method. Then, the source electrode 406 and the drain electrode 407 were formed by photolithography and etching methods.

An SiO$_2$ film was further deposited as a protective layer 405 on top of these electrodes to a thickness of 100 nm by a sputtering method. In the present exemplary embodiment, the RF power applied at that time was 400 W. The atmosphere applied at the time of film-forming was at a full pressure of 0.1 Pa, and the gas flow rate ratio at that time was Ar:O$_2$=50:50. The film-forming rate was 2 nm/min. In addition, the substrate temperature was 25° C.

Next, a display unit which uses the above-described TFT will be described using FIG. 7. The drain electrode of the TFT was extended by up to 100 µm. After securing wiring lines to the source and gate electrodes while leaving over 90 µm of the extended portion, the TFT was coated with an insulating layer. A polyimide film was coated on the insulating layer and a rubbing process was applied. On the other hand, there was prepared a component wherein an ITO film and a polyimide film were formed also on a plastic substrate and whereto a rubbing process was applied. The component was faced with a substrate, wherein the above-described TFT was formed, with a 5 µm gap therebetween, and a nematic crystal liquid was injected into the gap. In addition, one each of a pair of polarizing plates was provided on both sides of this structure. When at this point, a voltage was applied to the source electrode of the TFT to change the applied voltage of the gate electrode, a change took place in the optical transmittance of only a 30 µm×90 µm region, which was part of the ITO film extended from the drain electrode. In addition, the transmittance could also be changed continuously by the source-drain voltage under a gate voltage at which the TFT was in an on state. In this way, a display unit using a liquid crystal cell as a display device and corresponding to FIG. 7 was fabricated.

In the present exemplary embodiment, a display unit has a structure in which a white plastic substrate is used as a substrate on which a TFT is to be formed, the respective electrodes of the TFT are replaced with those made of gold, and the polyimide film and the polarizing plates are eliminated. In addition, the display device is structured so that a capsule wherein particles and a fluid are sealed with an insulating film is loaded into a gap between the white and transparent substrates. In the case of the display unit having this structure, a voltage between the extended drain electrode and the ITO film on top thereof is controlled by the TFT. As a result, particles within the capsule move up and down. Thus, it is possible to create a display by controlling the reflectance ratio of the extended drain electrode region as viewed from the transparent substrate.

Also in the present exemplary embodiment, it is possible to adjacently form a plurality of TFTs to configure, for example, a usual current-controlled circuit comprised of 4 transistors and 1 capacitor. Then, one of the final-stage transistors is used as the TFT illustrated in FIG. 6, to drive an EL device. For example, a TFT which uses the aforementioned ITO film as the drain electrode thereof is used. Then, an organic electroluminescence device comprised of a charge injection layer and a luminescent layer is formed in a 30 µm×90 µm region which is part of an island of the ITO film extended from the drain electrode. In this way, it is possible to form a display unit which uses the EL device.

The thin-film transistor (TFT) of the present invention can be applied as the switching device of a display unit, such as an LCD or an organic EL display. In addition, it is possible to incorporate all TFT processes in a flexible material, including a plastic film, at low temperatures. Thus, the TFT can be widely applied to not only flexible displays but also to IC cards and ID tags.

The present invention is not limited to the above-mentioned embodiments and various changes and modifications can be made within the spirit and scope of the present invention. Therefore to apprise the public of the scope of the present invention, the following claims are made.

This application claims priority from Japanese Patent Application No. 2007-050004 filed on Feb. 28, 2007, which is hereby incorporated by reference herein.

The invention claimed is:

1. A method of manufacturing a thin-film transistor comprising at least the steps of:
   forming a gate electrode on a substrate;
   forming a gate insulating layer;
   forming an amorphous oxide semiconductor layer containing In, Ga and Zn and having an electron carrier density of $10^{14}$/cm$^3$ or more and $10^{18}$/cm$^3$ or less while controlling an oxygen partial pressure;
   forming a source electrode and a drain electrode; and
   forming a protective layer;
   wherein the forming of the protective layer is performed by a sputtering method in an oxygen-containing atmosphere in which a mixed gas of O$_2$ and Ar is used and the O$_2$/Ar mixing ratio of the mixed gas is 20% or more and 50% or less so that the gate electrode-side electron carrier density of the oxide semiconductor layer is higher than the protective layer-side electron carrier density thereof.

2. The method of manufacturing a thin-film transistor according to claim 1, wherein the protective layer contains at least one of SiOxNy, SiO$_2$, Al$_2$O$_3$, Ga$_2$O$_3$, In$_2$O$_3$, MgO, CaO, SrO, BaO, ZnO, Nb$_2$O$_5$, Ta$_2$O$_5$, TiO$_2$, ZrO$_2$, HfO$_2$, CeO$_2$, Li$_2$O, Na$_2$O, K$_2$O, Rb$_2$O, Sc$_2$O$_3$, Y$_2$O$_3$, La$_2$O$_3$, Nd$_2$O$_3$, Sm$_2$O$_3$, Gd$_2$O$_3$, Dy$_2$O$_3$, Er$_2$O$_3$, and Yb$_2$O$_3$.

* * * * *